United States Patent
Ukai

(10) Patent No.: US 7,260,128 B2
(45) Date of Patent: Aug. 21, 2007

(54) SEMICONDUCTOR LASER DEVICE, SEMICONDUCTOR LASER SYSTEM, OPTICAL PICKUP MODULE AND MANUFACTURING FOR SEMICONDUCTOR LASER SYSTEM

(75) Inventor: Tsutomu Ukai, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 207 days.

(21) Appl. No.: 10/849,554

(22) Filed: May 20, 2004

(65) Prior Publication Data
US 2005/0008054 A1    Jan. 13, 2005

(30) Foreign Application Priority Data
May 20, 2003    (JP)    ............... 2003-141314

(51) Int. Cl.
H01S 5/00    (2006.01)
(52) U.S. Cl. ................... 372/43.01; 372/64
(58) Field of Classification Search ........... 372/43.01, 372/64
See application file for complete search history.

(56) References Cited
U.S. PATENT DOCUMENTS
5,559,819 A * 9/1996 Abe et al. ............. 372/46.01
5,898,722 A * 4/1999 Ramdani et al. ....... 372/50.121
6,646,975 B1    11/2003 Uchizaki et al.

FOREIGN PATENT DOCUMENTS

| JP | 5-218582 | 8/1993 |
|---|---|---|
| JP | 2000-11417 A | 1/2000 |
| JP | 2001-057462 | 2/2001 |
| JP | 2001-345514 A | 12/2001 |
| JP | 2002-111136 | 4/2002 |
| JP | 2002-289977 A | 10/2002 |

\* cited by examiner

Primary Examiner—Dung (Michael) T. Nguyen
(74) Attorney, Agent, or Firm—McDermott Will & Emery LLP

(57) ABSTRACT

A semiconductor laser device comprises an n-type cladding layer 103 made of n⁻type $(Al_{0.3}Ga_{0.7})_{0.5}In_{0.5}P$, an undoped active layer 104 and a first p-type cladding layer 105 made of p⁻type $(Al_{0.3}Ga_{0.7})_{0.5}In_{0.5}P$. These layers are successively stacked in bottom-to-top order. The active layer 104 has a multi-quantum well structure composed of a first optical guide layer of undoped $Al_{0.4}Ga_{0.6}As$, a layered structure in which well layers of undoped GaAs and barrier layers of undoped $Al_{0.4}Ga_{0.6}As$ are alternately formed, and a second optical guide layer of undoped $Al_{0.4}Ga_{0.6}As$. The first optical guide layer, the layered structure and the second optical guide layer are successively stacked in bottom-to-top order.

12 Claims, 13 Drawing Sheets

SEMICONDUCTOR LASER DEVICE, SEMICONDUCTOR LASER SYSTEM, OPTICAL PICKUP MODULE AND MANUFACTURING FOR SEMICONDUCTOR LASER SYSTEM

BACKGROUND OF THE INVENTION (1) Field of the Invention

The present invention relates to an optical pickup module, a semiconductor laser device and a semiconductor laser system both incorporated into the optical pickup module, and a method for manufacturing a semiconductor laser system.

(2) Description of Related Art

In recent years, the widespread use of optical disk systems has advanced the increase of the recording density of an optical disk. The optical disk systems have been demanded not only to reproduce data from CDs but also to reproduce data from and record data in write-once CDs (CD-Rs).

By the way, a red laser with a wavelength of a 650 nm band is used to reproduce data from DVDs, and an infrared laser with a wavelength of a 780 nm band is used to reproduce data from and record data in CDs or CD-Rs.

Accordingly, at present, systems for reproducing data from and recording data in DVDs and CDs (RAMBO systems) each require two laser devices of red and infrared semiconductor laser devices and optical components corresponding to the laser devices.

On the other hand, with size reduction of notebook computers or the like, the RAMBO systems have been demanded to become more compact. Therefore, optical pickup modules need become more compact.

To cope with this, a monolithic two-wavelength semiconductor laser system is suggested which is obtained by integrating a red semiconductor laser device and an infrared semiconductor laser device. In the two-wavelength semiconductor laser system, the integration of the two semiconductor laser devices allows the shared use of an optical system and data reproduction and recording with a single optical component. Therefore, optical pickup modules can be made more compact and thinner.

However, crystal growth must be carried out many times to fabricate a monolithic two-wavelength semiconductor laser system obtained by integrating a red semiconductor laser device and an infrared semiconductor laser device on a single substrate. Thus, the number of process steps increases, leading to increased cost.

In order to reduce cost, it is desired that the number of crystal growths is as small as possible. For that purpose, it is preferable that an infrared laser device structure serves as a basis for a semiconductor laser system and a red laser device structure is added to the infrared laser device structure.

However, it is generally difficult to fabricate a red semiconductor laser device made of a material other than AlGaInP-based materials. Hence, it should be considered that a red semiconductor laser device is inevitably made of an AlGaInP-based material.

Thus, an infrared semiconductor laser device need be made of a material that can be grown while being lattice-matched to the AlGaInP-based material.

An infrared semiconductor laser device is typically made of GaAs or AlGaAs that is a material containing As. However, a part of its structure can be made of a material containing Phosphorus (P), such as an AlGaInP-based material, instead of GaAs or AlGaAs, to fabricate an infrared semiconductor laser device. The use of an AlGaInP-based material for an infrared semiconductor laser device permits the simultaneous crystal growths of layers necessary for a red semiconductor laser device and an infrared semiconductor laser device. This does not lead to increase in the number of process steps in fabricating a monolithic two-wavelength semiconductor laser system. Thus, the use of an AlGaInP-based material for an infrared semiconductor is useful for cost reduction. In particular, the use of an infrared semiconductor laser device using a material containing P for cladding layers suppresses the overflow of carriers as compared with the use of cladding layers made of a material containing arsenic (As), thereby obtaining excellent temperature characteristics. Therefore, stable characteristics can be obtained even in a hostile environment such as an environment surrounding a vehicle-mounted infrared semiconductor laser device.

In relation to infrared semiconductor laser devices using a material containing P for cladding layers, there are suggested structures and fabrication methods as disclosed in Japanese Unexamined Patent Publication No. 5-218582 (hereinafter, referred to as Document 1), Japanese Unexamined Patent Publication No. 2001-57462 (hereinafter, referred to as Document 2), and Japanese Unexamined Patent Publication No. 2002-111136 (hereinafter, referred to as Document 3).

Infrared semiconductor laser devices having cladding layers made of a material containing P as disclosed in Documents 1 and 2 are each fabricated on a single-crystal substrate by successively growing the crystals of a cladding layer of a first conductive type, an active layer and a cladding layer of a second conductive type.

However, in the infrared semiconductor laser devices, a GaAs-based or AlGaAs-based material need be used for an active layer because of a desired emission wavelength. In this case, it is difficult to obtain excellent crystallinity on the interface between a cladding layer made of a material containing P and an active layer made of a material containing As.

FIG. 13 illustrates an energy band diagram of a known infrared semiconductor laser device having cladding layers made of a material containing P. As seen from FIG. 13, the energy difference between each cladding layer and the optical guide layer contacting the cladding layer is secured, because the optical guide layer is also composed of a material containing phosphorus (P), specifically, GaInP.

By the way, in an actual fabrication process, a cladding layer, an optical guide layer and an active layer are typically successively grown by metal organic chemical vapor deposition (hereinafter, referred to as MOCVD) or the like. When the cladding layers and the optical guide layers are formed of a material containing P, the source gas need be switched from a gas containing P to a gas containing As in growing a well layer constituting the active layer.

In this case, the gas containing P and the gas containing As coexist in a reactor. This causes a loss of the steepness of composition change or the like at the interfaces between the optical guide layers and the active layers. Therefore, the following problems occur: an injection current becomes uneven; and a multi-quantum well layer has a longer wavelength than the designed wavelength and thus emission intensity becomes extremely feeble.

The active layer determines the characteristics of the semiconductor laser element, such as wavelength and lifetime, and is therefore required to have excellent crystallinity.

However, it turned out that when a cladding layer made of $(Al_{0.5}Ga_{0.5})_{0.5}In_{0.5}P$ is grown on the substrate and then a multi-quantum well layer made of GaAs/(Al$_{0.5}$Ga$_{0.5}$)$_{0.5}$In$_{0.5}$P is grown on the cladding layer, the substrate surface is whitened and therefore the designed wavelength cannot be obtained.

It is considered that the reason for this is that since the multi-quantum well layer was grown with a gas containing P and a gas containing As mixed, its epitaxial growth has been done unsuccessfully. When the crystallinity of the active layer is thus impaired due to a cross contamination in switching the source gas, the device reliability decreases in lifetime and resistance regardless of the obtainment of the designed wavelength.

Document 3 discloses an example in which an AlGaAs-based optical guide layer is placed between an AlGaInP-based cladding layer and an active layer. In this case, a multi-quantum well layer has a layered structure composed of a well layer made of Al$_x$Ga$_{1-x}$As (x≦0.15) and a barrier layer made of In$_{0.5}$(Ga$_{1-x}$Al$_z$)$_{0.5}$P (0≦z≦0.2). Therefore, the source gas need be switched from a gas containing P to a gas containing As. Hence, the problem that excellent crystals cannot be obtained is not solved.

SUMMARY OF THE INVENTION

In view of the above, an object of the present invention is to improve the reliability of an infrared semiconductor laser device comprising cladding layers of a material containing phosphorus (P) and an active layer containing arsenic (As) but containing no phosphorus (P).

In order to attain the above object, a semiconductor laser device of the present invention comprises a cladding layer of a first conductive type, an active layer and a cladding layer of a second conductive type, said layers being stacked on a semiconductor substrate of the first conductive type in bottom-to-top order, wherein the active layer comprises a layered structure composed of at least one pair of a well layer and a barrier layer, an upper semiconductor layer formed on top of the layered structure, and a lower semiconductor layer formed beneath the layered structure, the cladding layer of the first conductive type and the cladding layer of the second conductive type are made of a material containing phosphorus, and the at least one pair of the well layer and barrier layer and the lower semiconductor layer are made of a material that contains arsenic but does not substantially contain phosphorus.

Herein, a material that does not substantially contain phosphorus means that even if a film formed by growth contains phosphorus, this phosphorus is contained due to cross contamination in a growth device, i.e., phosphorus is not intentionally contained in a crystal.

According to the semiconductor laser device of the present invention, since the at least one pair of a well layer and a barrier layer constituting the active layer are made of a material that contains arsenic but does not substantially contain phosphorus, the active layer can emit infrared light. The lower semiconductor layer is formed below the layered structure composed of at least one pair of a well layer and a barrier layer and is made of a material that contains arsenic but does not substantially contain phosphorus. Therefore, when the layered structure composed of at least one pair of a well layer and a barrier layer is grown after the growth of the lower semiconductor layer, the source gas need not be switched between a gas containing arsenic and a gas containing phosphorus. Since a problem of contamination associated with the switching of the source gas is not thus caused, the layered structure constituting the active layer can have excellent crystallinity. This can improve the character-istics and reliability of an infrared semiconductor laser device having cladding layers made of a material containing phosphorus and an active layer that contains arsenic but contain no phosphorus.

In the semiconductor laser device of the present invention, the upper semiconductor layer is preferably made of a material that contains arsenic but does not substantially contain phosphorus.

In the semiconductor laser device of the present invention, the upper and lower semiconductor layers are preferably optical guide layers.

When the upper and lower semiconductor layers are optical guide layers, the band gap of each optical guide layer is equivalent to or larger than that of the well layer.

When the upper and lower semiconductor layers are optical guide layers, it is preferable that the cladding layer of the first conductive type and the cladding layer of the second conductive type are made of (Al$_x$Ga$_{1-x}$)$_y$In$_{1-y}$P (where 0≦x≦1 and 0≦y≦1) and the optical guide layers are made of Al$_x$Ga$_{1-x}$As (where 0≦x≦1).

In this case, it is preferable that the well layer is made of Al$_x$Ga$_{1-x}$As (where 0≦x≦1) and the barrier layer is made of Al$_x$Ga$_{1-x}$As (where 0≦x≦1).

Furthermore, in this case, the well layer is preferably made of Al$_x$Ga$_{1-x}$As (where 0≦x≦0.2).

Moreover, in this case, the optical guide layers are preferably made of Al$_x$Ga$_{1-x}$As (where 0.4≦x≦1).

When the upper and lower semiconductor layers are optical guide layers, it is preferable that the optical guide layers each have a thickness of 10 nm or more.

A semiconductor laser system of the present invention comprises a plurality of semiconductor laser devices for emitting light beams of different wavelengths, said plurality of semiconductor laser devices being formed on a single substrate, wherein at least one of the plurality of semiconductor laser devices is any semiconductor laser device of the present invention.

The semiconductor laser device of the present invention can improve the characteristics and reliability of an infrared semiconductor laser device that constitutes a multi-wavelength semiconductor laser system comprising semiconductor laser devices for emitting light beams of a plurality of different wavelengths.

A first optical pickup module of the present invention comprises: any semiconductor laser device of the present invention; and a light receiving unit for receiving light reflected from a recording medium after being emitted from the semiconductor laser device.

The first optical pickup module of the present invention can improve the characteristics and reliability of an infrared semiconductor laser device serving as a light source.

A second optical pickup module of the present invention comprises: a semiconductor laser system of the present invention; and a light receiving unit for receiving light reflected from a recording medium after being emitted from the semiconductor laser system.

The second optical pickup module of the present invention can improve the characteristics and reliability of an infrared semiconductor laser device that constitutes a multi-wavelength semiconductor laser system serving as a light source.

A method for manufacturing a semiconductor laser system of the present invention comprises the steps of: forming a first double-heterojunction structure on a semiconductor substrate; removing a predetermined region of the first double-heterojunction structure to form a first semiconductor laser device of the remaining first double-heterojunction structure; forming a second double-heterojunction structure on the semiconductor substrate including the top surface of the remaining first double-heterojunction structure; and removing a region of the second double-heterojunction structure located on the remaining first double-heterojunction structure to form a second semiconductor laser device of the remaining second double-heterojunction structure, wherein the step of forming a first double-heterojunction structure comprises the steps of: forming a first cladding layer made of a material containing phosphorus on the semiconductor substrate; forming, on the first cladding layer, a lower semiconductor layer made of a material that contains arsenic but does not substantially contain phosphorus, then forming, on the lower semiconductor layer, a layered structure made of a material that contains arsenic but does not substantially contain phosphorus and composed of at least one pair of a well layer and a barrier layer, and then forming an upper semiconductor layer on the layered structure, thereby forming a first active layer composed of the lower semiconductor layer, the layered structure and the upper semiconductor layer; and forming, on the first active layer, a second cladding layer made of a material containing phosphorus, and the step of forming a second double-heterojunction structure comprises the steps of: forming a third cladding layer made of a material containing phosphorus on the semiconductor substrate including the top surface of the first semiconductor laser device; forming a second active layer on the third cladding layer; and forming a fourth cladding layer on the second active layer.

According to the method for manufacturing a semiconductor laser device of the present invention, the lower semiconductor layer that contains arsenic but does not substantially contain phosphorus is formed on the first cladding layer made of a material containing phosphorus. Thereafter, the layered structure is formed on the lower semiconductor layer. The layered structure is made of a material that contains arsenic but does not substantially contain phosphorus and constitutes the first active layer. Therefore, when the layered structure constituting the first active layer is grown after the growth of the lower semiconductor layer, the source gas need not be switched between a gas containing arsenic and a gas containing phosphorus. Since a problem of contamination associated with the switching of the source gas is not thus caused, the layered structure constituting the first active layer can have excellent crystallinity. This can improve the characteristics and reliability of a first semiconductor laser device of a first double-heterojunction structure.

In the method for manufacturing a semiconductor laser system, the step of forming a first double-heterojunction structure preferably comprises the step of continuously growing the first cladding layer, the first active layer and the second cladding layer.

DETAILED DESCRIPTION OF THE INVENTION (Embodiment 1)

A description will be given below of a semiconductor laser device according to a first embodiment of the present invention with reference to FIGS. 1 through 7.

Figure 1:
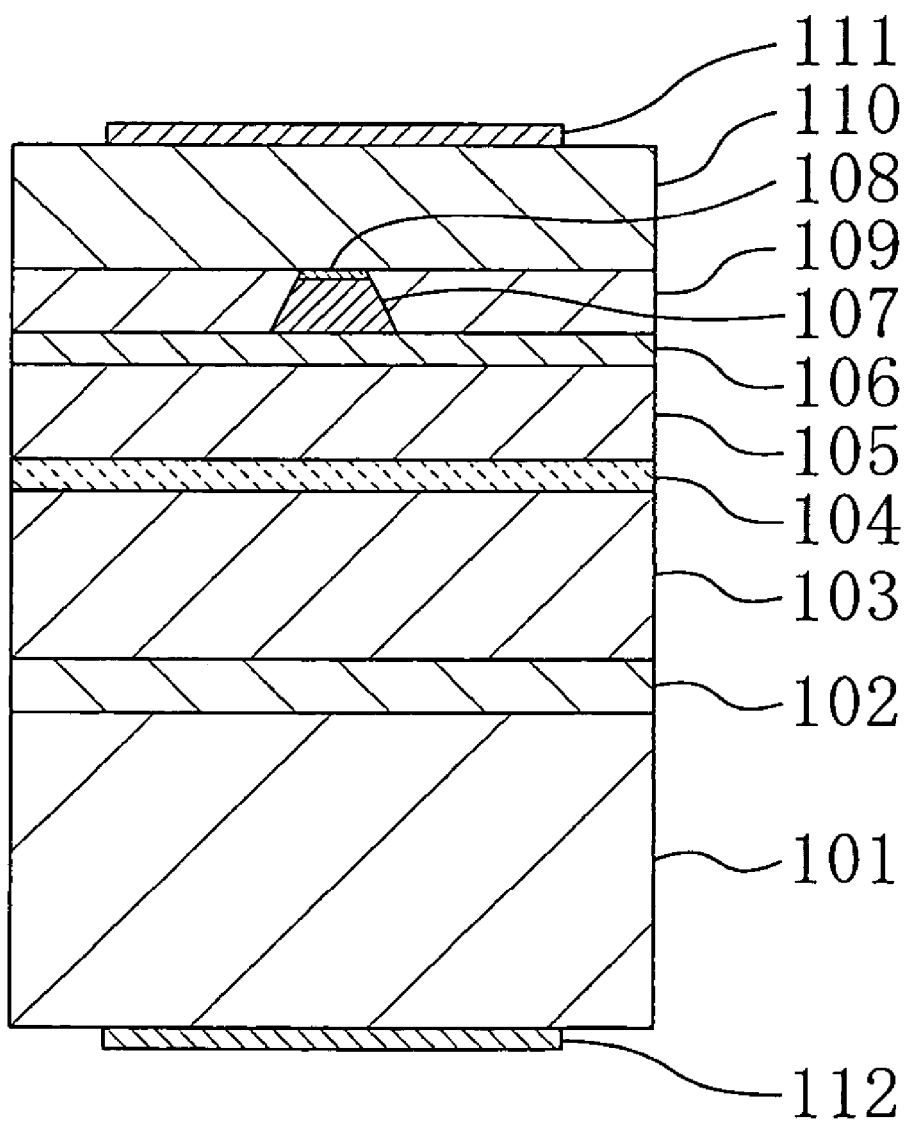
FIG. 1 is a cross-sectional view illustrating the structure of a semiconductor laser device according to a first embodiment of the present invention.

FIG. 1 illustrates the structure of an infrared semiconductor laser device according to the first embodiment. As shown in FIG. 1, a buffer layer 102 of n$^-$type GaAs (Si doping amount: $1.0 \times 10^{18}$ cm$^-$3) is formed on a substrate 101 of n-type GaAs (Si doping amount: $1.0 \times 10^{18}$ cm$^-$3). The buffer layer 102 is formed thereon to allow an n$^-$type cladding layer 103 that will be described later to have excellent crystallinity.

A double-heterojunction structure is formed on the buffer layer 102. The double heterojunction structure is composed of an n$^-$type cladding layer 103 of n-type $(Al_{0.3}Ga_{0.7})_{0.5}In_{0.5}P$ (Si doping amount: $1.0 \times 10^{18}$ cm$^-$3), an undoped active layer 104, a first p-type cladding layer 105 of p$^-$type $(Al_{0.3}Ga_{0.7})_{0.5}In_{0.5}P$ (Zn doping amount: $3 \times 10^{17}$cm$^-$3), an etching stopper layer 106 of p$^-$type $Ga_{0.5}In_{0.5}P$ (Zn doping amount: $1 \times 10^{18}$ cm$^-$3), a second p-type cladding layer 107 of p$^-$type $(Al_{0.3}Ga_{0.7})_{0.5}I)_{0.5}In$ (Zn doping amount: $1 \times 10^{18}$ cm$^-$3), and a contact layer 110 of p$^-$type GaAs (Zn doping amount: $3 \times 10^{18}$ cm$^-$3). These layers are successively stacked in bottom-to-top order.

The second p-type cladding layer 107 is processed to take the form of a stripe-shaped ridge. A cap layer 108 of p⁻type $Ga_{0.5}In_{0.5}P$ (Zn doping amount: $2\times10^{18} cm^{-3}$) is formed on the second p⁻type cladding layer 107.

Figure 2:
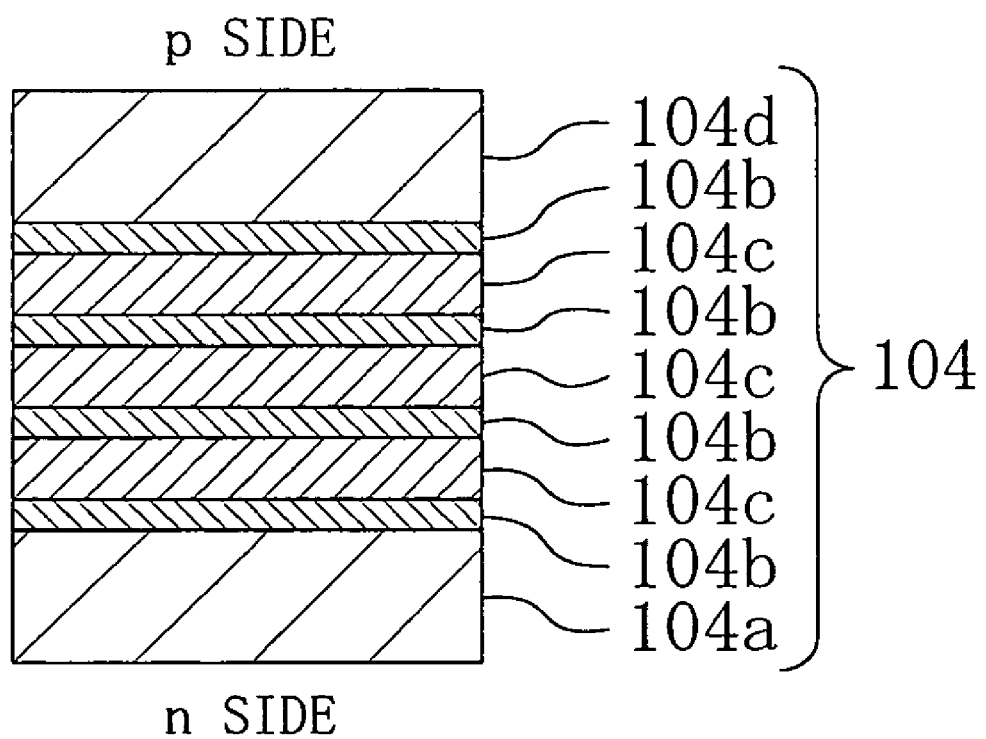
FIG. 2 is a cross-sectional view illustrating the structure of an active layer of the semiconductor laser device according to the first embodiment of the present invention.

FIG. 2 illustrates the structure of the active layer 104. As shown in FIG. 2, the active layer 104 has a multi-quantum well structure composed of a first optical guide layer 104a of undoped $Al_{0.4}Ga_{0.6}As$, a layered structure in which four well layers 104b of undoped GaAs and three barrier layers 104c of undoped $Al_{0.4}Ga_{0.6}As$ are alternately stacked, and a second optical guide layer 104d of undoped $Al_{0.4}Ga_{0.6}As$. The first optical guide layer 104a, the layered structure and the second optical guide layer 104d are successively stacked in bottom-to-top order.

The thicknesses of the first and second optical guide layers 104a and 104d are each preferably 10 nm or more. The reason for this will be described later.

There are considerations in determining the In, Ga and Al contents in the n-type cladding layer 103, the active layer 104, the first p-type cladding layer 105, the etching stopper layer 106, a second p-type cladding layer 107, and the cap layer 108, which constitute the double-heterojunction structure. These considerations are that each layer (103, 104, 105, 106, 107, 108) is substantially equivalent in lattice constant to the substrate 101, and that each of the n-type cladding layer 103 and the first p-type cladding layer 105 has band gap energy larger than that of the active layer 104.

A current blocking layer 109 of n⁻type $Al_{0.5}In_{0.5}P$ (Si doping amount: $1.0\times10^{18}$ cm⁻3) is formed on both sides of the second p-type cladding layer 107, and the contact layer 110 of p⁻type GaAs (Zn doping amount: $7\times10^{18}$ cm⁻3) is formed on the cap layer 108 and the current blocking layer 109.

A p-side electrode 111 is formed on the top surface of the contact layer 110, and an n-side electrode 112 is formed on the bottom surface of the substrate 101.

Furthermore, the layers other than the p-side and n-side electrodes 111 and 112 are all formed by a crystal growth method using MOCVD.

A light wave is guided by the first p-type cladding layer 105 and the second p-type cladding layer 107 processed to take the form of a stripe-shaped ridge.

The n-type cladding layer 103 has a thickness of 1.5 μm, the active layer 104 has a thickness of 50 nm, and the first and second optical guide layers 104a and 104d constituting the active layer 104 each have a thickness of 10 nm. The first p-type cladding layer 105 and the ridge-shaped second p-type cladding layer 107 each have a thickness of 0.85 μm, and the etching stopper layer 106 has a thickness of 10 nm. The ridge-shaped second p-type cladding layer 107 has a width of 3.5 μm at the ridge top.

Figure 3:
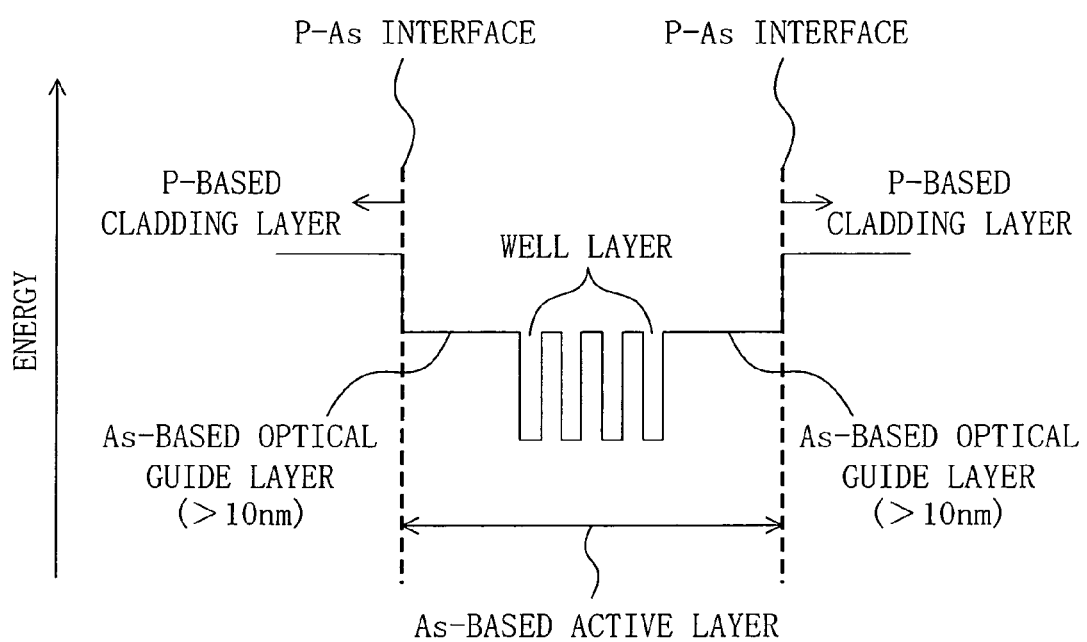
FIG. 3 is an energy band diagram of the semiconductor laser device according to the first embodiment of the present invention.

FIG. 3 illustrates an energy band diagram of an infrared semiconductor laser device according to the first embodiment. As seen from FIG. 3, the interfaces between the layers made of a material containing P and the layers made of a material containing As (P-As interfaces) shift from the interfaces between the well layers and the optical guide layers to the interfaces between the optical guide layers and the cladding layers.

A description will be given below of the effects produced by the fact that the P-As interfaces move from the interfaces between the well layer and the optical guide layers to the interfaces between the optical guide layers and the cladding layers.

As described above, in order to fabricate an infrared semiconductor laser device with a wavelength of a 780 nm band using a material containing P, the source gas need be switched from a material containing P (cladding layer) to a material containing As (active layer).

Figure 4:
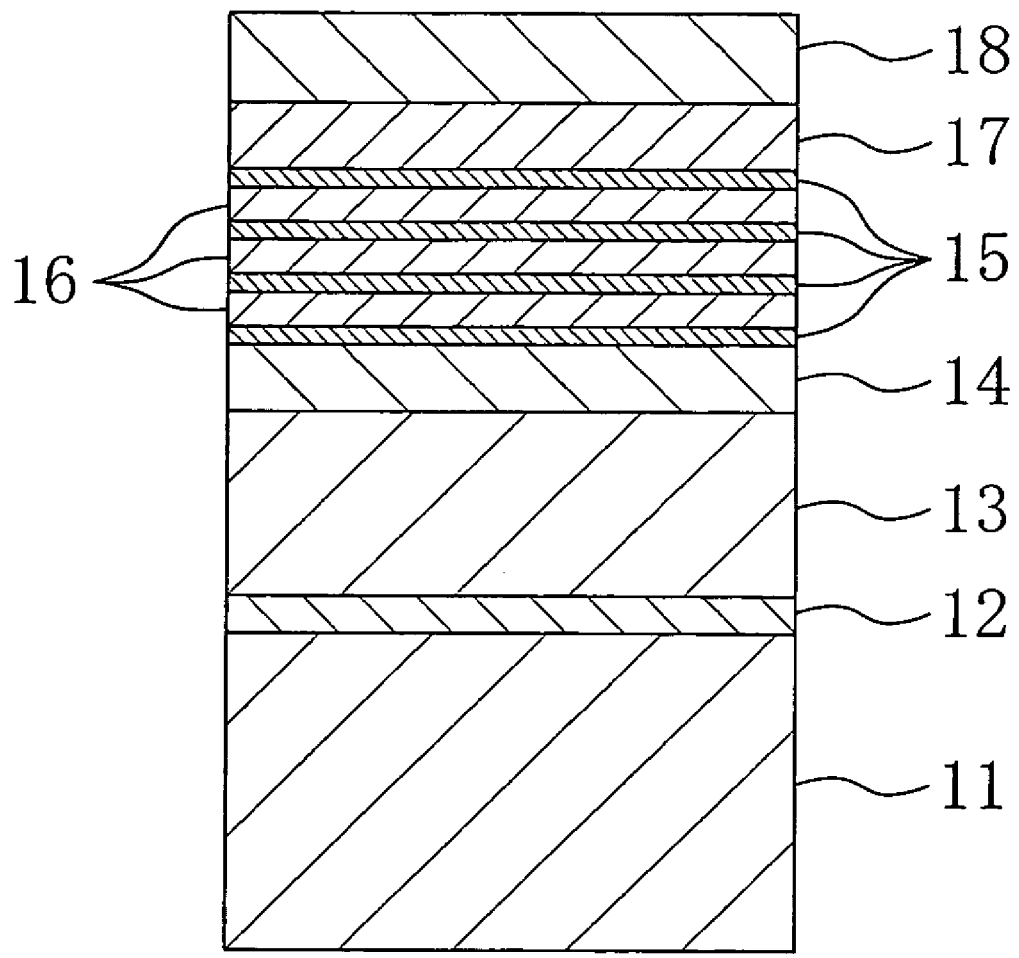
FIG. 4 is a cross-sectional view illustrating a semiconductor layered structure used to measure the photoluminescence (hereinafter, referred to as PL) of the semiconductor laser device according to the first embodiment of the present invention.

FIG. 4 is a cross-sectional view illustrating a semiconductor layered structure for measuring photoluminescence (hereinafter, referred to as PL) according to the first embodiment.

The semiconductor layered structure is formed in the following manner. A buffer layer 12 of n⁻type GaAs and an undoped first cladding layer (its thickness: 0.5 μm) 13 of $(Al_{0.5}Ga_{0.5})_{0.5}In_{0.5}P$ are successively grown on a substrate 11 of n⁻type GaAs. Thereafter, a first optical guide layer 14 of $Al_{0.4}Ga_{0.6}As$, a layered structure in which four well layers 15 of GaAs and three barrier layers 16 of $Al_{0.4}Ga_{0.6}As$ are alternately stacked, and a second optical guide layer 17 of $Al_{0.4}Ga_{0.6}As$ are grown on the first cladding layer 13. Then, an undoped second cladding layer (its thickness: 0.15 μm) 18 of $(Al_{0.5}Ga_{0.5})_{0.5}In_{0.5}P$ is grown on the second optical guide layer 17.

Figure 5:
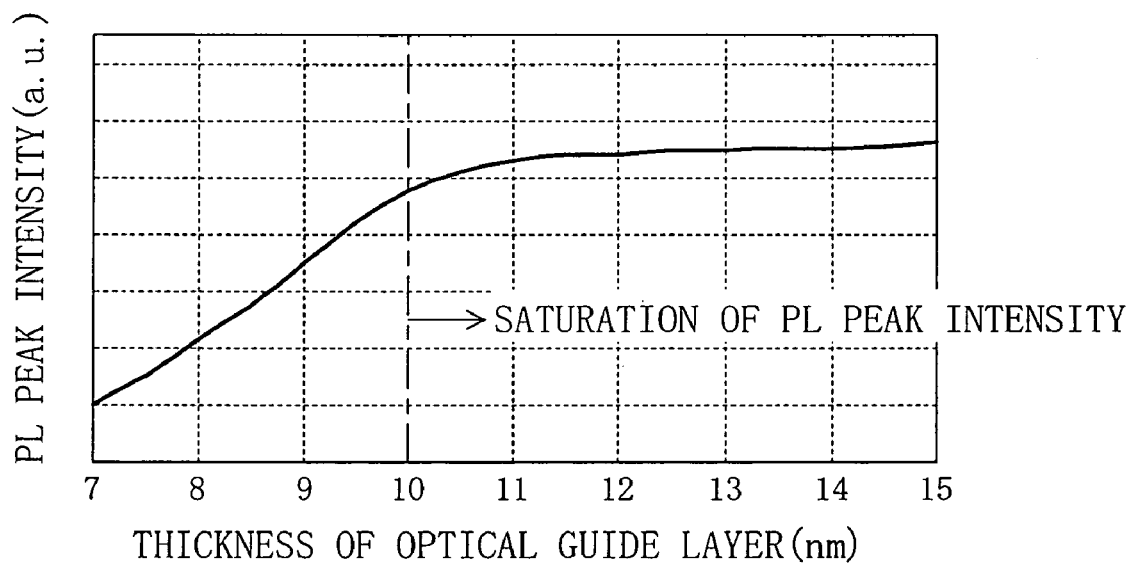
FIG. 5 is a graph illustrating variations in PL peak intensity of the semiconductor layered structure used to measure the PL of the semiconductor laser device according to the first embodiment of the present invention with the change in the thickness of an optical guide layer.

FIG. 5 illustrates variations in the PL peak intensity of the semiconductor layered structure shown in FIG. 4 with the change in the thicknesses of the first and second optical guide layers 14 and 17. It is seen from FIG. 5 that with the increasing thickness of each of the first and second optical guide layers 14 and 17, the PL peak intensity is increasing. This indirectly means that the crystallinity of the active layer becomes better with the increasing thickness of each of the first and second optical guide layers 14 and 17. Furthermore, when the first and second optical guide layers 14 and 17 each have a thickness of 10 nm or more, the intensity of a PL peak wavelength is saturated. This represents that an active layer whose interfaces have excellent steepness is fabricated within the range in which the first and second optical guide layers 14 and 17 each have a thickness of 10 nm or more.

Figure 6:
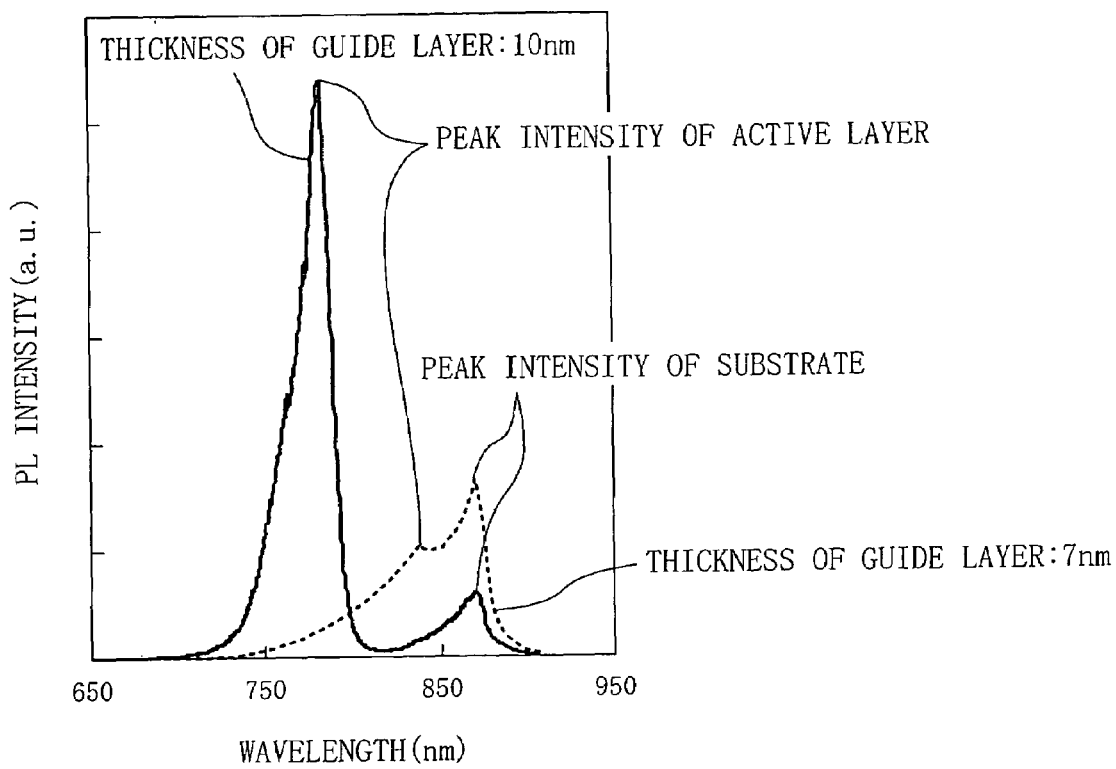
FIG. 6 is a graph illustrating the relationship between the PL wavelength and intensity of the semiconductor layered structure used to measure the PL of the semiconductor laser device according to the first embodiment of the present invention when the thickness of the optical guide layer is 7 or 10 nm.

FIG. 6 illustrates the correlation between the PL wavelength and intensity of the semiconductor layered structure shown in FIG. 4 when the first and second optical guide layers 14 and 17 each have a thickness of 7 nm or 10 nm. As seen from FIG. 6, when the first and second optical guide layers 14 and 17 each have a thickness of 7 nm, the intensity of the PL wavelength is smaller as compared with when they each have a thickness of 10 nm, and the peak wavelength is shifted to a longer wavelength side in spite of the same quantum well structure.

The reason for this is considered as follows. When the first optical guide layer 14 has a small thickness, the crystallinity of the first optical guide layer 14 is degraded due to the influence of contamination with P from the source gas containing P in the formation of the first cladding layer 13 and a quantum well layer is grown on the first optical guide layer 14 having degraded crystallinity. On the other hand, when the first optical guide layer 14 has a larger thickness, a part of the first optical guide layer 14 that is not affected by P contamination has a larger thickness and thus the crystallinity of the part is recovered. This also provides an excellent crystallinity of the quantum well layer grown on the first optical guide layer 14 and thus stable characteristics of the active layer.

It is seen from the above descriptions based on FIGS. 5 and 6 that when the first and second optical guide layers 14 and 17 each have a thickness of 10 nm or more, this provides an excellent crystallinity of the active layer.

As described above, according to the semiconductor laser device of the first embodiment, the infrared semiconductor laser having cladding layers made of a material containing P can suppress the influence of P contamination in the crystal growth of the optical guide layer. Thus, the semiconductor laser device can have stable characteristics and high reliability. Furthermore, since the source gas can be switched in the same reactor, the crystal growth of each layer can successively be carried out. This can reduce facilities necessary for the film formation and improve throughput.

The energy bands of optical guide layers will be described hereinafter.

Document 1 discloses the following problem. If the band gap difference between each of cladding layers made of AlGaInP and an active layer made of GaAs is large, a large band discontinuity is present in a valence band. This causes a hetero-spike, which interferes with hole injection. In a semiconductor laser device of Document 1, optical guide layers of GaInP are provided between cladding layers and the corresponding well layers, thereby reducing the band discontinuity.

On the other hand, according to the first embodiment, the band gap between each of the n-type cladding layer 103 and the first p-type cladding layer 105 and the well layer 104$b$ can gently be changed by adjusting the Al contents of the first and second optical guide layers 104$a$ and 104$d$. More particularly, if the compositions of the first and second optical guide layers 104$a$ and 104$b$ are each set to $Al_xGa_{1-x}As$ (x=0.4) as in the first embodiment, the first and second optical guide layers 104$a$ and 104$d$ can have the same band gap as the optical guide layers of GaInP disclosed in Document 1. If the Al content x is 0.4 or more, the energy band is substantially continuous and injection current becomes uniform.

Since in the first embodiment the first and second optical guide layers 104$a$ and 104$d$ each have a thickness of 10 nm or more, holes are moved smoothly, which are injected through the first and second optical guide layers 104$a$ and 104$d$ into the well layers 104$b$. Thus, the above problem concerning the hetero-spike is solved. Furthermore, Zn can be restrained from being diffused from the first p-type cladding layer 105 into the active layer 104. This prevents the active layer 104 from being degraded in its crystallinity during a reliability test.

Figure 7A:
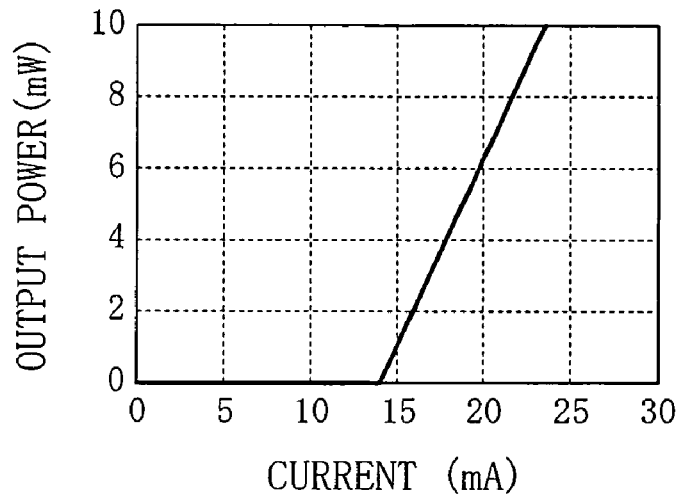
FIG. 7A is a graph illustrating the current-light output characteristics of a known semiconductor laser device.
Figure 7B:
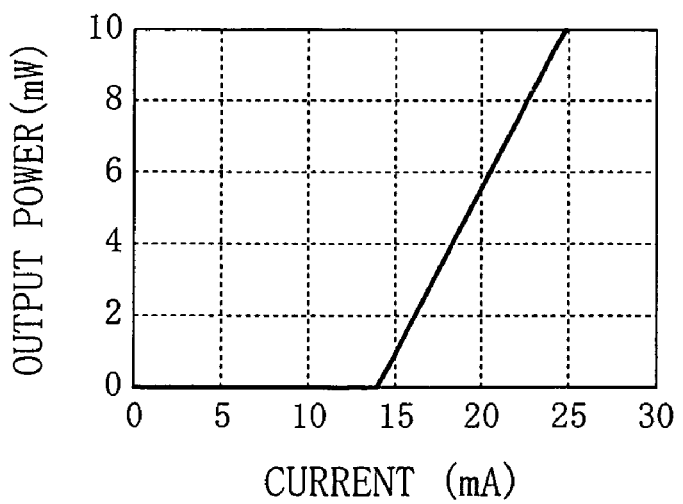
FIG. 7B is a graph illustrating the current-light output characteristics of the semiconductor laser device according to the first embodiment.

FIG. 7A illustrates the current-light output characteristics (I-L characteristics) of a known semiconductor laser device having cladding layers made of AlGaAs. FIG. 7B illustrates the current-light output characteristics of the semiconductor laser device of the first embodiment having cladding layers made of AlGaInP. As seen from comparison between FIGS. 7A and 7B, the semiconductor laser device of the first embodiment can bear comparison in characteristics with the known semiconductor laser device having cladding layers made of a GaAs-based material.

Moreover, the semiconductor laser device of the first embodiment can ensure a large band gap difference between each of the n-type cladding layer 103 and the first p-type cladding layer 105 and the active layer 104. This can suppress the overflow of carriers and reduce reactive current.

The actual test on the semiconductor laser device has shown that the operating characteristics do not vary until a temperature of approximately 200° C. This means that the semiconductor laser device of the first embodiment of the present invention is suitable for operations in motor vehicles or in hostile environments.

The orientation of the principal surface of the substrate 101 is inclined about 10 degrees from (100) in the [011] or [0-11] direction. The reason for this is that a natural superlattice is restrained from growing during the growth of the AlGaInP layer and thus the AlGaInP layer can precisely be controlled to have a desired composition.

(Embodiment 2)

A description will be given of a two-wavelength semiconductor laser system and a method for manufacturing the same according to a second embodiment of the present invention with reference to FIGS. 8, 9 and 10A through 11C.

Figure 8:
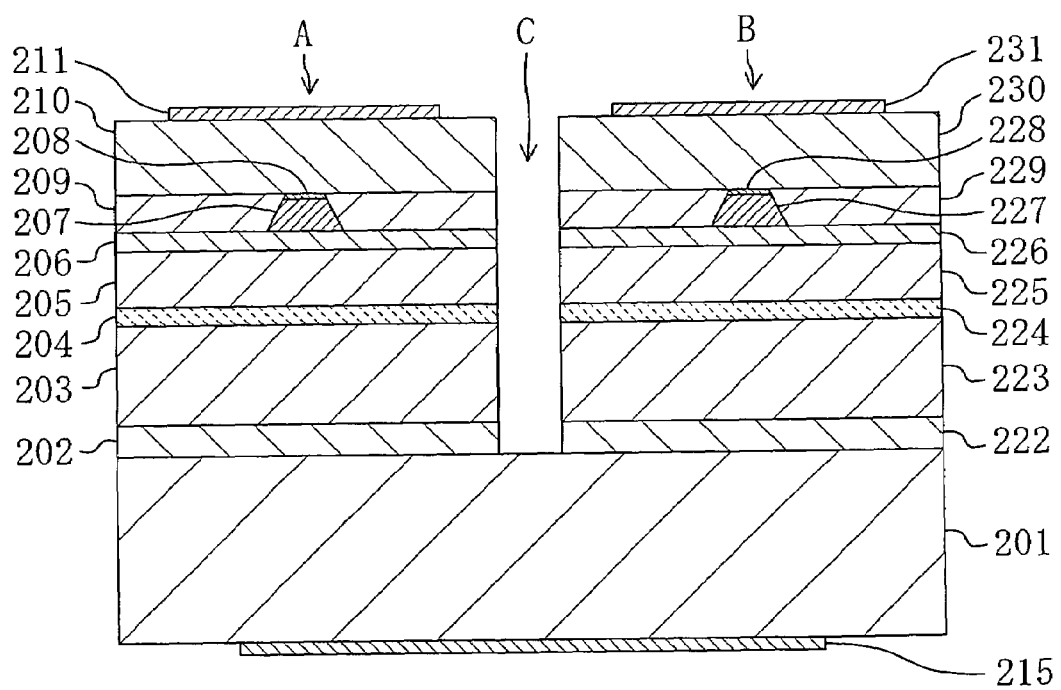
FIG. 8 is a cross-sectional view illustrating the structure of a two-wavelength semiconductor laser system according to a second embodiment of the present invention.

FIG. 8 illustrates the structure of a monolithic two-wavelength semiconductor laser system in which an infrared laser device A and a red laser device B are formed on the same substrate. The infrared laser device A emits a light beam with a wavelength of a 780 nm band, and the red laser device B emits a light beam with a wavelength of a 650 nm band. The infrared laser device A is separated from the red laser device B by an isolation trench C reaching the substrate.

The structure of the infrared laser device A will be described hereinafter.

Stacked on a substrate 201 of n$^-$type GaAs in bottom-to-top order are a buffer layer 202 of n$^-$type GaAs (Si doping amount: $1.0 \times 10^{18}$ cm$^-$3), an n-type cladding layer 203 of n$^-$type $(Al_{0.3}Ga_{0.7})_{0.5}In_{0.5}P$ (Si doping amount: $1.0 \times 10^{18}$ cm$^-$3), an undoped infrared active layer 204, a first p-type cladding layer 205 of p$^-$type $(Al_{0.3}Ga_{0.7})_{0.5}In_{0.5}P$ (Zn doping amount: $3 \times 10^{17}$ cm$^-$3), an etching stopper layer 206 of p$^-$type $Ga_{0.5}In_{0.5}P$ (Zn doping amount: $1 \times 10^{18}$ cm$^-$3), a second p-type cladding layer 207 of p$^-$type $(Al_{0.3}Ga_{0.7})_{0.5}In_{0.5}P$ (Zn doping amount: $1 \times 10^{18}$ cm$^-$3), and a cap layer 208 of p$^-$type $Ga_{0.5}In_{0.5}P$. The buffer layer 202 is formed on the substrate 201 to allow the n-type cladding layer 203 to have excellent crystallinity. The infrared active layer 204 has the same structure as that described in the first embodiment with reference to FIG. 2.

The second p-type cladding layer 207 is processed to take the form of a stripe-shaped ridge, and the stripe-shaped cap layer 208 is formed on the second p-type cladding layer 207. A current blocking layer 209 of n$^-$type $Al_{0.5}In_{0.5}P$ (Si doping amount: $1.0 \times 10^{18}$ cm$^-$3) is formed on both sides of the second p-type cladding layer 207, and a contact layer 210 of p$^-$type GaAs (Zn doping amount: $7 \times 10^{18}$ cm$^-$3) is formed on the cap layer 208 and the current blocking layer 209.

A p-side electrode 211 is formed on the top surface of the contact layer 210, and an n-side electrode 215 is formed on the bottom surface of the substrate 201.

The structure of the red laser device B will be described hereinafter.

Stacked on the substrate 201 in bottom-to-top order are a buffer layer 222 of n$^-$type GaAs (Si doping amount: $1.0 \times 10^{18}$ cm$^-$3), an n-type cladding layer 223 of n$^-$type $(Al_{0.3}Ga_{0.7})_{0.5}In_{0.5}P$ (Si doping amount: $1.0 \times 10^{18}$ cm$^-$3), an undoped red active layer 224, a first p-type cladding layer 225 of p$^-$type $(Al_{0.3}Ga_{0.7})_{0.5}In_{0.5}P$ (Zn doping amount: $5 \times 10^{17}$ cm$^-$3), an etching stopper layer 226 of p$^-$type $Ga_{0.5}In_{0.5}P$ (Zn doping amount: $1 \times 10^{18}$ cm$^{-3}$), a second p-type cladding layer 227 of p$^-$type $(Al_{0.3}Ga_{0.7})_{0.5}In_{0.5}P$ (Zn doping amount: $1 \times 10^{18}$ cm$^-$3), and a cap layer 228 of p$^-$type $Ga_{0.5}In_{0.5}P$. The buffer layer 222 is formed on the substrate 201 to allow the n-type cladding layer 223 to have excellent crystallinity.

The second p-type cladding layer 227 is processed to take the form of a stripe-shaped ridge, and the stripe-shaped cap layer 228 is formed on the second p-type cladding layer 227. A current blocking layer 229 of n type $Al_{0.5}In_{0.5}P$ (Si doping amount: $1.0 \times 10^{18}$ cm$^-$3) is formed on both sides of the second p-type cladding layer 227, and a contact layer 230 of p$^-$type GaAs (Zn doping amount: $7 \times 10^{18}$ cm$^-$3) is formed on the cap layer 228 and the current blocking layer 229.

A p-side electrode 231 is formed on the top surface of the contact layer 230.

Figure 9:
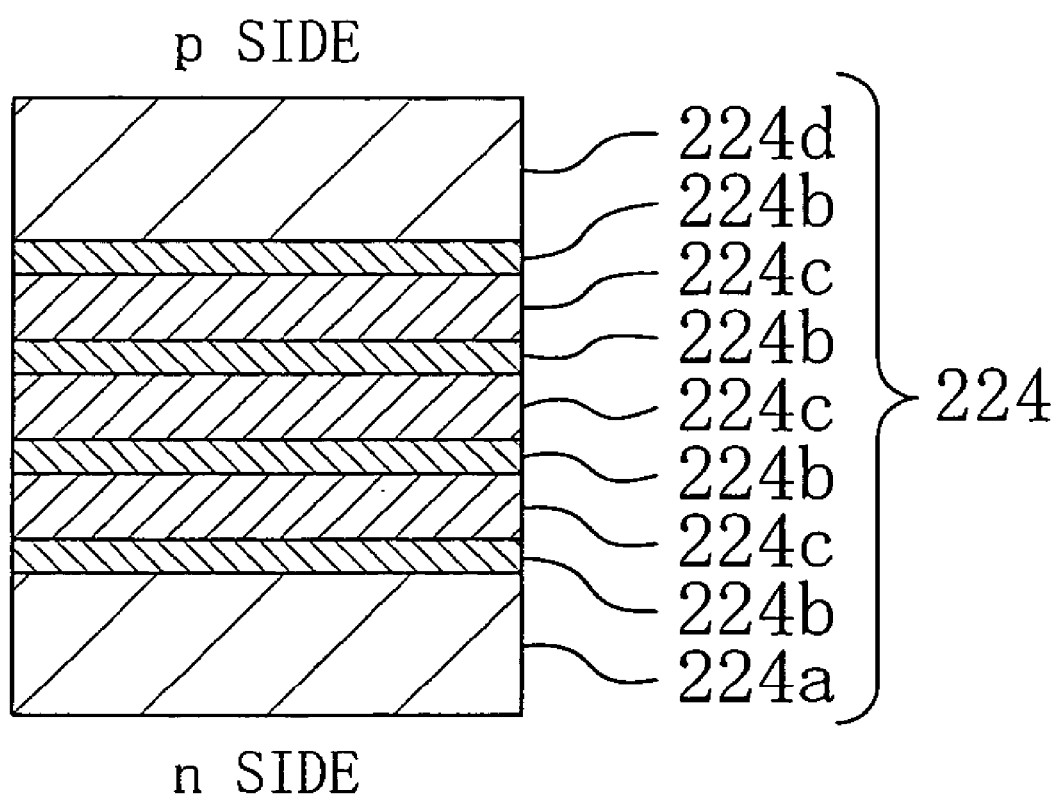
FIG. 9 is a cross-sectional view illustrating the structure of a red laser active layer of the two-wavelength semiconductor laser system according to the second embodiment of the present invention.

FIG. 9 illustrates the structure of the red active layer 224. As shown in FIG. 9, the red active layer 224 has a multi-quantum well structure composed of a first optical guide layer 224a of undoped $(Al_{0.5}Ga_{0.5})_{0.5}In_{0.5}P$, a layered structure in which four well layers 224b of undoped $Ga_{0.5}In_{0.5}P$ and three barrier layers 224c of undoped $(Al_{0.5}Ga_{0.5})_{0.5}In_{0.5}P$ are alternately stacked, and a second optical guide layer 224d of undoped $(Al_{0.5}Ga_{0.5})_{0.5}In_{0.5}P$. The first optical guide layer 224a, the layered structure and the second optical guide layer 224d are successively stacked in bottom-to-top order.

There are considerations in determining the In, Ga and Al contents in each layer 203 through 208 of the infrared laser device A and each layer 223 through 228 of the red laser device B. These considerations are that each layer is substantially equivalent in lattice constant to the substrate 201, the n-type cladding layer 203 and the first p-type cladding layer 205 have a larger band gap energy than the infrared active layer 204, and the n-type cladding layer 223 and the first n-type cladding layer 225 have larger band gap energy than the infrared active layer 224.

The method for manufacturing a semiconductor laser system according to the second embodiment will be described hereinafter with reference to FIGS. 10A through 11B.

Figure 10A:
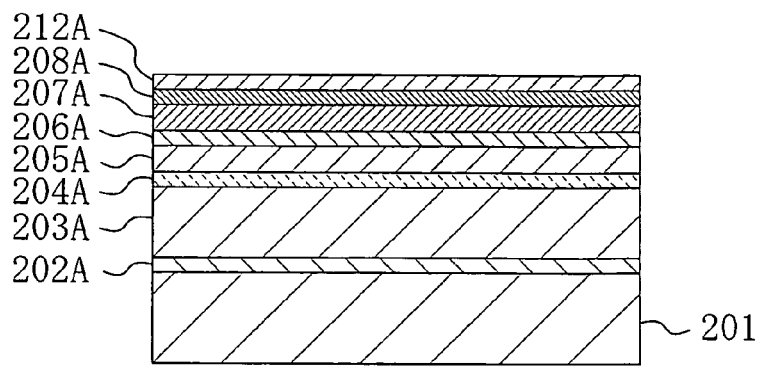
FIGS. 10A through 10C are cross-sectional views showing process steps in a method for manufacturing a two-wavelength semiconductor laser system according to the second embodiment of the present invention.

First, as shown in FIG. 10A, an n⁻type GaAs layer 202A, an n⁻type $(Al_{0.3}Ga_{0.7})_{0.5}In_{0.5}P$ layer 203A, an undoped layered structure 204A, a p⁻type $(Al_{0.3}Ga_{0.7})_{0.5}In_{0.5}P$ layer 205A, a p⁻type $Ga_{0.5}In_{0.5}P$ layer 206A, a p⁻type $(Al_{0.3}Ga_{0.7})_{0.5}In_{0.5}P$ layer 207A, a p⁻type $Ga_{0.5}In_{0.5}P$ layer 208A, and a p⁻type GaAs layer 212A are successively grown on a substrate 201 of n⁻type GaAs by MOCVD, thereby forming an infrared double-heterojunction structure. The growth of the infrared double-heterojunction structure using MOCVD is continuously carried out by switching the source gas in the same reactor.

Figure 10B:
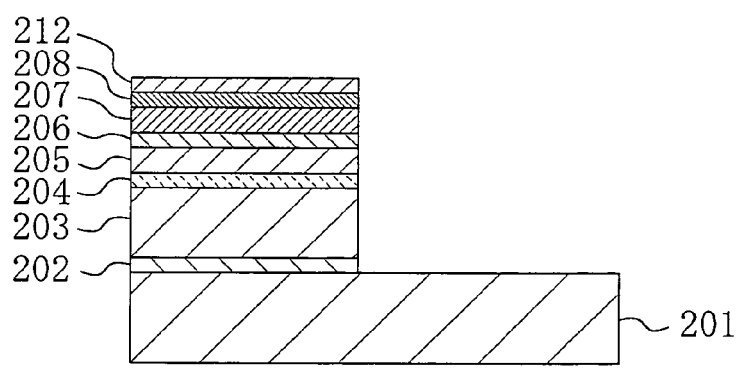

Next, the region of the infrared double-heterojunction structure to be formed with the red semiconductor laser device B is removed by etching until it reaches the substrate 201. In this way, as shown in FIG. 10B, a buffer layer 202, an n-type cladding layer 203, an undoped infrared active layer 204, a first p-type cladding layer 205, an etching stopper layer 206, a second p-type cladding layer 207, a cap layer 208, and a cap layer 212 are formed on the substrate 201.

The reason why the infrared double-heterojunction structure is grown earlier than a red double-heterojunction structure is as follows. In the red double-heterojunction structure, a material containing P, for example, GaInP or AlGaInP, is used also for a red active layer. In films made of these materials, the rate at which Zn is diffused under a temperature higher than 500° C. is ten or more times as fast as in those made of materials containing As, for example, GaAs or AlGaAs. Hence, when the red double-heterojunction structure is formed earlier, Zn is diffused from the first and second p-type cladding layers 205 and 207 or the like during the later crystal growth. As a result, the band gap and lasing wavelength vary. In other words, when the infrared double-heterojunction structure is grown earlier than the red double-heterojunction structure, this can prevent Zn from being diffused into the multi-quantum well layer constituting the red active layer.

Since in the second embodiment the first and second optical guide layers 204a and 204d each have a thickness of 10 nm or more in the infrared double-heterojunction structure, this can more noticeably prevent Zn from being diffused into the multi-quantum well layer.

Figure 10C:
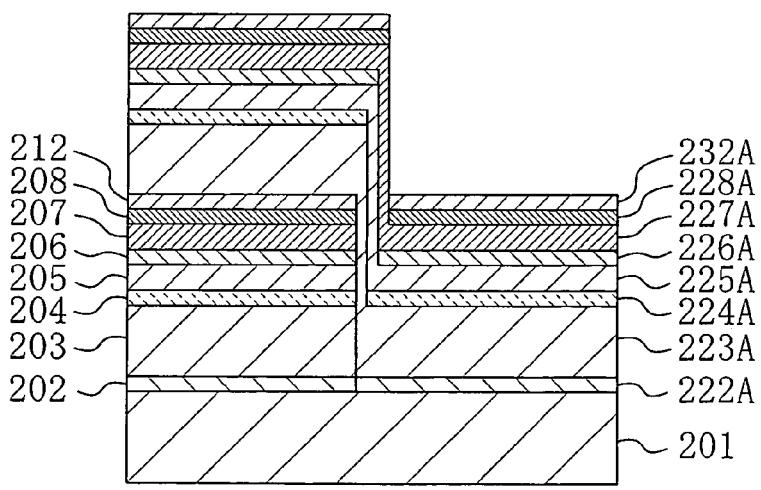

Next, as shown in FIG. 10C, an n⁻type GaAs layer 222A, an n⁻type $(Al_{0.3}Ga_{0.7})_{0.5}In_{0.5}P$ layer 223A, an undoped red active layer 224A, a p⁻type $(Al_{0.3}Ga_{0.7})_{0.5}In_{0.5}P$ layer 225A, a p⁻type $Ga_{0.5}In_{0.5}P$ layer 226A, and a p⁻type $(Al_{0.3}Ga_{0.7})_{0.5}In_{0.5}P$ layer 227A, a p⁻type $Ga_{0.5}In_{0.5}P$ layer 228A, and a p⁻type GaAs layer 232A are successively grown on the substrate 201 including the patterned infrared double-heterojunction structure by MOCVD, thereby forming a red double-heterojunction structure. The growth of the red double-heterojunction structure using MOCVD is continuously carried out by switching the source gas in the same reactor.

Figure 11A:
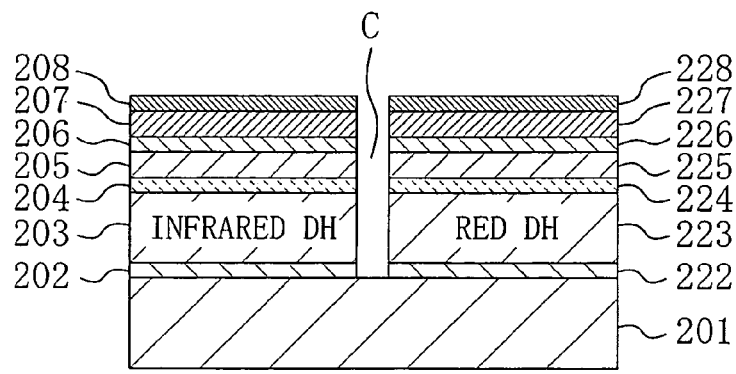
FIGS. 11A through 11C are cross-sectional views showing the other process steps in the method for manufacturing a two-wavelength semiconductor laser system according to the second embodiment.

Next, the region of the red double-heterojunction structure formed on the infrared double-heterojunction structure, the cap layer 212, the p⁻type GaAs layer 232A, and the region of the red double-heterojunction structure to be formed with an isolation trench C are removed by etching. In this way, as shown in FIG. 11A, the infrared double-heterojunction structure (referred to as infrared DH in this figure) and the red double-heterojunction structure (referred to as red DH in this figure) are formed on the substrate 201. The infrared double-heterojunction structure is composed of the buffer layer 202, the n-type cladding layer 203, the undoped infrared active layer 204, the first p-type cladding layer 205, the etching stopper layer 206, the second p-type cladding layer 207, and the cap layer 208. The red double-heterojunction structure is composed of a buffer layer 222, an n-type cladding layer 223, an undoped red active layer 224, a first p-type cladding layer 225, an etching stopper layer 226, a second p-type cladding layer 227, and a cap layer 228.

Figure 11B:
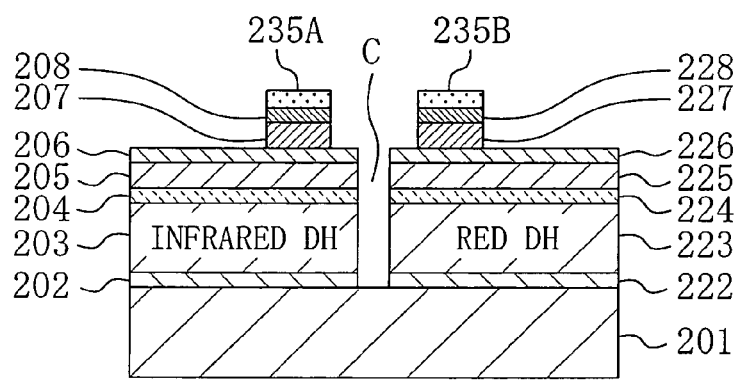

Next, an $SiO_2$ film is deposited on the infrared double-heterojunction structure and the red double-heterojunction structure. Thereafter, as shown in FIG. 11B, a stripe-shaped first mask pattern 235A and a stripe-shaped second mask pattern 235B both made of a $SiO_2$ film are formed, by lithography and etching, on the predetermined regions of the infrared double-heterojunction structure and the red double-heterojunction structure, respectively.

Next, the second p-type cladding layer 207 and the cap layer 208 both constituting the infrared double-heterojunction structure are etched using the first mask pattern 235A as a mask until this etching reaches the etching stopper film 206. In this way, a stripe-shaped-ridge-like second p-type cladding layer 207 and a stripe-shaped cap layer 208 are formed on the infrared double-heterojunction structure. The second p-type cladding layer 227 and the cap layer 228 both constituting the red double-heterojunction structure are etched using the second mask pattern 235B as a mask until this etching reaches the etching stopper film 226. In this way, a stripe-shaped-ridge-like second p-type cladding layer 227 and a stripe-shaped cap layer 228 are formed on the red double-heterojunction structure.

In the second embodiment, the second p-type cladding layer 207 and the cap layer 208 in the infrared double-heterojunction structure have the same compositions as the second p-type cladding layer 227 and the cap layer 228 in the red double-heterojunction structure, respectively. Therefore, the stripe-shaped second p-type cladding layers 207 and 227 and the cap layers 208 and 228 can be formed by one etching process step. This can reduce the number of process steps.

Figure 11C:
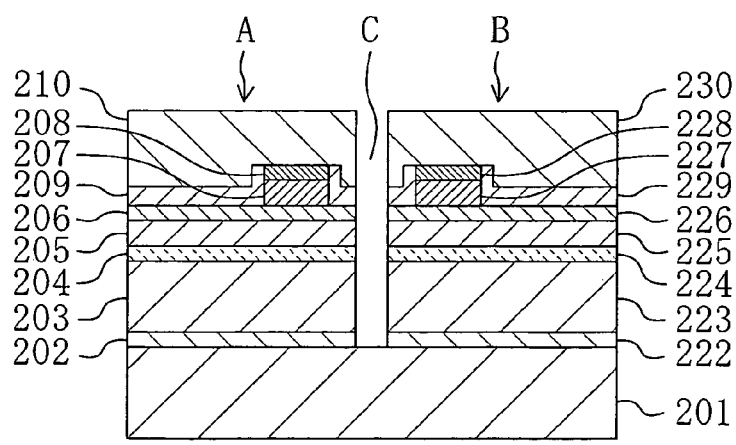

Next, as shown in FIG. 11C, a current blocking layer 209 made of n⁻type $Al_{0.5}In_{0.5}P$ is grown on the infrared double-heterojunction structure by MOCVD, and a current blocking layer 229 made of n⁻type $Al_{0.5}In_{0.5}P$ is grown on the red double-heterojunction structure. In this case, the current blocking layers 209 and 229 are formed by the same crystal growth process step. An n⁻type $Al_{0.5}In_{0.5}P$ layer does not grow on the first and second mask patterns 235A and 235B made of a $SiO_2$ film.

Next, after the removal of the first and second mask patterns 235A and 235B, a contact layer 210 made of p⁻type GaAs and a contact layer 230 made of p⁻type GaAs are grown by MOCVD on the infrared double-heterojunction structure and the red double-heterojunction structure, respectively. Thereafter, an n⁻type $Al_{0.5}In_{0.5}P$ layer and a p⁻type GaAs layer are removed which have been grown inside the isolation trench C. In this way, an infrared semiconductor laser device A and a red semiconductor laser device B are formed on the substrate 201.

Next, a metal film is deposited on the top surfaces of the infrared semiconductor laser device A and the red semiconductor laser device B, and thereafter the metal film is patterned to from p-side electrodes 211 and 231 (see FIG. 8). Next, a metal film is deposited on the bottom surface of the infrared semiconductor laser device A and the red semiconductor laser device B, and thereafter the metal film is patterned to form an n-side electrode 215 (see FIG. 8).

According to the method for manufacturing a semiconductor laser system of the second embodiment, the stripe-shaped second p-type cladding layer 207 and the cap layer 208 of the infrared double-heterojunction structure can be formed simultaneously with the stripe-shaped second p-type cladding layer 227 and the cap layer 228 of the red double-heterojunction structure. In addition, the current blocking layer 209 and the contact layer 210 of the infrared double-heterojunction structure can be formed simultaneously with the current blocking layer 229 and the contact layer 230 of the red double-heterojunction structure. Therefore, the number of process steps can be reduced.

More particularly, when in the monolithic two-wavelength semiconductor laser system a material containing P is not used for the infrared semiconductor laser device A, six crystal growth process steps are required. However, when a material containing P is used for the infrared semiconductor laser device A as in the second embodiment, only four crystal growth process steps are required. This can reduce cost in a manufacturing process.

In the second embodiment, the orientation of the principal surface of the n⁻type GaAs substrate 201 is inclined about 10 degrees from (100) in the [011] or [011] direction as in the first embodiment. The reason for this is that a natural superlattice is restrained from growing during the growth of the AlGaInP layer and thus the AlGaInP layer can precisely be controlled to have a desired composition.

In particular, this inclination is effective for the red semiconductor laser device B in preventing the occurrence of abnormalities in the band gap of the red active layer 224 to obtain the lasing wavelength as designed.

In the first and second embodiments, optical guide layers are placed in both the upper and lower parts of the multi-quantum well structure. However, in terms of preventing the crystallinity of the multi-quantum well structure from being degraded, an optical guide layer made of a material containing As need only be provided in at least the lower part of the multi-quantum well structure.

In the first and second embodiments, a layer contacting the multi-quantum well structure need not necessarily be an optical guide layer.

In the second embodiment, the isolation trench C may be formed after the formation of the contact layers 210 and 230 made of p⁻type GaAs. Furthermore, it may be filled with an insulating film of an $SiO_2$ film or a low-dielectric-constant film. This ensures the insulation between the infrared laser device A and the red laser device B and improves their strengths. Therefore, the possibilities that cleavages of the devices occur or cracks occur during the packaging of these devices are reduced.

In the second embodiment, etching for forming the ridge shape and etching for forming the isolation trench C may be either wet etching or dry etching.

In the second embodiment, for example, $SiN_x$, instead of an $SiO_2$ film, may be used as the stripe-shaped first and second mask patterns 235A and 235B, as long as the selectivity of the mask patterns to the lower semiconductor layered structure is large enough.

(Embodiment 3)

Figure 12:
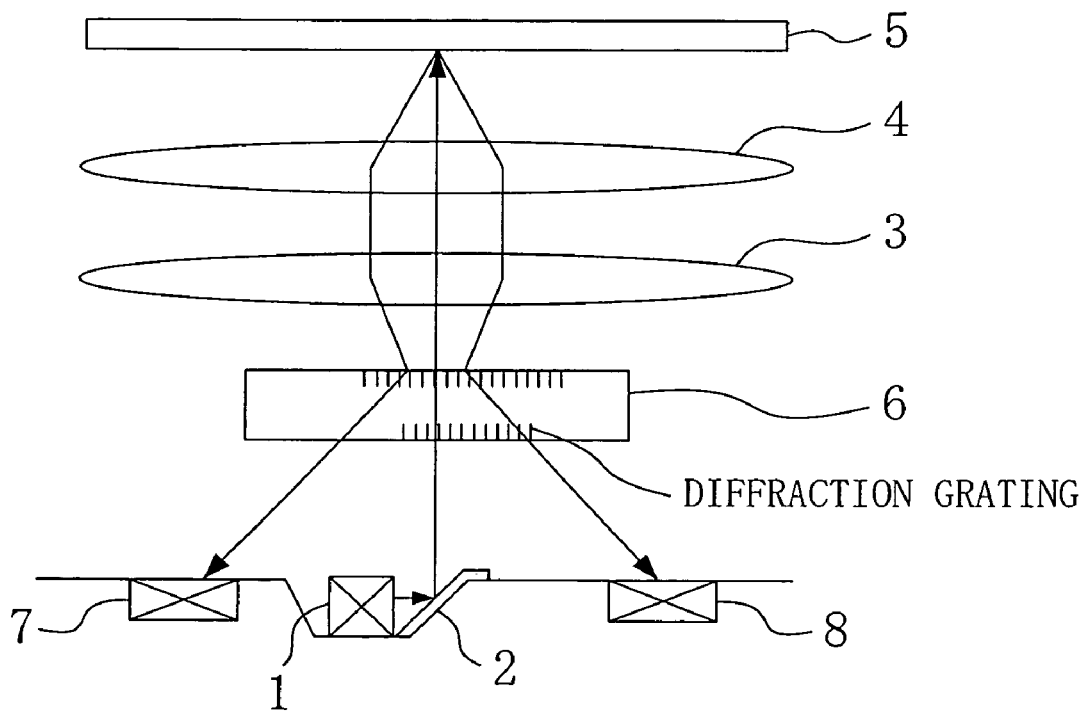
FIG. 12 is a schematic diagram illustrating the structure of an optical pickup module according to a third embodiment of the present invention.
Figure 13:
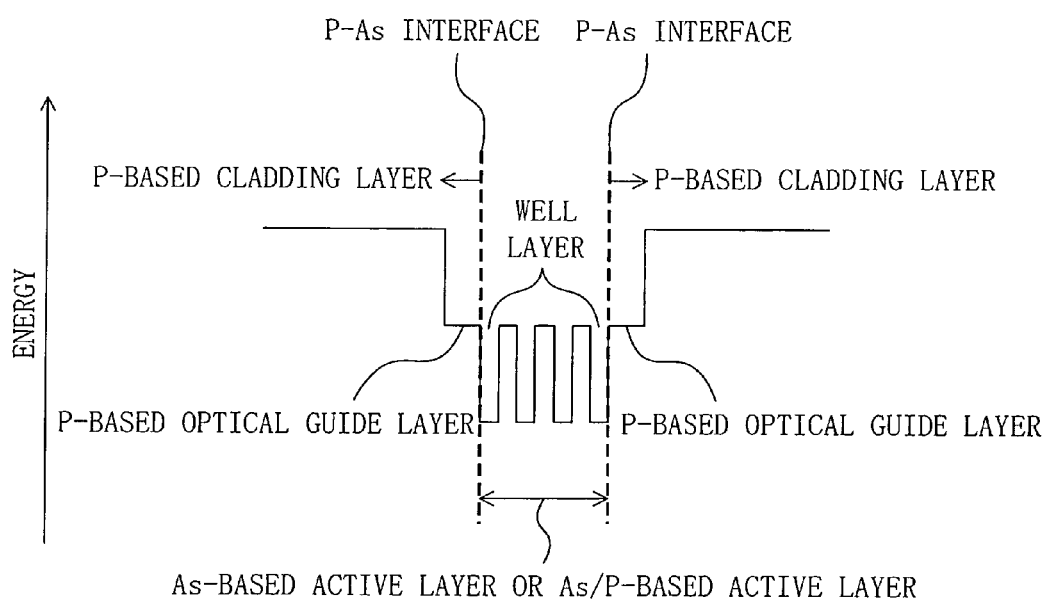
FIG. 13 is an energy band diagram of a known infrared semiconductor laser device.

An optical pickup module according to a third embodiment of the present invention will be described hereinafter with reference to FIG. 12.

The optical pickup module comprises a light source 1 composed of the monolithic two-wavelength semiconductor laser system according to the second embodiment. The light source 1 emits a red light beam with a wavelength of a 650 nm band and an infrared light beam with a wavelength of a 780 nm band.

The red light beam with a wavelength of a 650 nm band is used to record data in and reproduce data from a DVD. When data are reproduced from a DVD, a light beam emitted from the light source 1 is changed in its direction by a reflecting mirror 2. Thereafter, the light beam is converged through a collimator lens 3 and an objective lens 4 onto the recording surface of a disk 5. Reflected light beams from the recording surface of the disk 5 are incident through the objective lens 4 and the collimator lens 3 to a holographic element 6. The reflected light beams are diverged by the holographic element 6 and are incident to a plurality of light-receiving elements 7 and 8. Focus/tracking error signals and reproduction signals in the reproduction of the DVD are detected based on signals detected by the light-receiving elements 7 and 8.

On the other hand, the infrared light beam with a wavelength of a 780 nm band is used to record data in and reproduce data from a CD. When data are reproduced from a CD, a light beam emitted from the light source 1 is changed in its direction by the reflecting mirror 2 as in the use of the red light beam. Thereafter, the light beam is converged through the collimator lens 3 and the objective lens 4 onto the recording surface of the disk 5. Reflected light beams from the recording surface of the disk 5 are incident through the objective lens 4 and the collimator lens 3 to the holographic element 6. The reflected light beams are diverged by the holographic element 6 and are incident to the plurality of light-receiving elements 7 and 8. The focus/tracking error signals and reproduction signals in the reproduction of the CD are detected based on signals detected by the light-receiving elements 7 and 8.

Since in the third embodiment the semiconductor layer system serving as the light source 1 is a monolithic two-wavelength semiconductor laser system, the distance between light emitting points can be shortened. Therefore, the pickup module can be reduced in size and its optical systems can be consolidated into one system. This can reduce the number of optical system components, such as a lens, and cost.

Furthermore, since the semiconductor laser device emitting infrared light has a double-heterojunction structure composed of cladding layers of a material containing P and an active layer of a material that contains As but does not substantially contain P, this improves the reliability of the two-wavelength semiconductor laser system. Therefore, the optical pickup module can have higher performance and higher reliability.

In the third embodiment, a diffraction grating may be additionally provided for dividing a light beam emitted from the semiconductor laser system into three beams. In this case, the use of a three-beam method becomes possible. Thus, data are favorably reproduced from CDs or the like. A prism or a beam splitter may be used instead of the holographic element 6.

The structure and layout of components are not particularly restrictive as long as the optical pickup module can play its role successfully.

In the third embodiment, the semiconductor laser system of the second embodiment is used as the light source 1. Alternatively, the semiconductor laser device of the first embodiment alone may be used.

What is claimed is:

1. A semiconductor laser device comprising a cladding layer of a first conductive type, an active layer and a cladding layer of a second conductive type, said layers being stacked on a semiconductor substrate of the first conductive type in bottom-to-top order, wherein the active layer comprises a layered structure composed of at least one pair of a well layer and a barrier layer, an upper semiconductor layer directly formed on top of the layered structure and having a thickness of 10 nm or more, and a lower semiconductor layer directly formed beneath the layered structure and having a thickness of 10 nm or more, the cladding layer of the first conductive type and the cladding layer of the second conductive type are made of a material containing phosphorus, and the at least one pair of the well layer and barrier layer and the lower semiconductor layer are made of a material that contains arsenic but does not substantially contain phosphorus.

2. The semiconductor laser device of claim 1, wherein the upper semiconductor layer is made of a material that contains arsenic but does not substantially contain phosphorus.

3. The semiconductor laser device of claim 1, wherein the upper and lower semiconductor layers are optical guide layers.

4. The semiconductor laser device of claim 3, wherein the band gap of each said optical guide layer is equivalent to or larger than that of the well layer.

5. The semiconductor laser device of claim 3, wherein the cladding layer of the first conductive type and the cladding layer of the second conductive type are made of $(Al_xGa_{1-x})_yIn_{1-y}P$ (where $0 \leq x \leq 1$ and $0 \leq y \leq 1$), and the optical guide layers are made of $Al_xGa_{1-x}As$ (where $0 \leq x \leq 1$).

6. The semiconductor laser device of claim 5, wherein the well layer is made of $Al_xGa_{1-x}As$ (where $0 \leq x \leq 1$), and the barrier layer is made of $Al_xGa_{1-x}As$ (where $0 \leq x \leq 1$).

7. The semiconductor laser device of claim 5, wherein the well layer is made of $Al_xGa_{1-x}As$ (where $0 \leq x \leq 0.2$).

8. The semiconductor laser device of claim 5, wherein the optical guide layers are made of $Al_xGa_{1-x}As$ (where $0.4 \leq x \leq 1$).

9. The semiconductor laser device of claim 3, wherein the optical guide layers each have a thickness of 10 nm or more.

10. A semiconductor laser system comprising a plurality of semiconductor laser devices for emitting light beams of different wavelengths, said plurality of semiconductor laser devices being formed on a single substrate, wherein at least one of the plurality of semiconductor laser devices comprises a cladding layer of a first conductive type, an active layer and a cladding layer of a second conductive type, said layers being stacked on a semiconductor substrate of the first conductive type in bottom-to-top order, the active layer comprises a layered structure composed of at least one pair of a well layer and a barrier layer, an upper semiconductor layer directly fanned on top of the layered structure and having a thickness of 10 nm or more and a lower semiconductor layer directly formed beneath the layered structure and having a thickness of 10 nm or more, the cladding layer of the first conductive type and the cladding layer of the second conductive type are made of a material containing phosphorus, and the at least one pair of the well layer and barrier layer and the lower semiconductor layer are made of a material that contains arsenic but does not substantially contain phosphorus.

11. An optical pickup module comprising:

a semiconductor laser device; and a light receiving unit for receiving light reflected from a recording medium after being emitted from the semiconductor laser device, wherein the semiconductor laser device comprises a cladding layer of a first conductive type, an active layer and a cladding layer of a second conductive type, said layers being stacked on a semiconductor substrate of the first conductive type in bottom-to-top order, the active layer comprises a layered structure composed of at least one pair of a well layer and a barrier layer, an upper semiconductor layer directly formed on top of the layered structure and having a thickness of 10 nm or more, and a lower semiconductor layer directly formed beneath the layered structure and having a thickness of 10 nm or more, the cladding layer of the first conductive type and the cladding layer of the second conductive type are made of a material containing phosphorus, and the at least one pair of the well layer and barrier layer and the lower semiconductor layer are made of a material that contains arsenic but does not substantially contain phosphorus.

12. An optical pickup module comprising:

a semiconductor laser system; and a light receiving unit for receiving light reflected from a recording medium after being emitted from the semiconductor laser system, wherein the semiconductor laser system comprises a plurality of semiconductor laser devices for emitting light beams of different wavelengths, said plurality of semiconductor laser devices being formed on a single substrate, at least one of the plurality of semiconductor laser devices comprises a cladding layer of a first conductive type, an active layer and a cladding layer of a second conductive type, said layers being stacked on a semiconductor substrate of the first conductive type in bottom-to-top order, the active layer comprises a layered structure composed of at least one pair of a well layer and a barrier layer, an upper semiconductor layer directly formed on top of the layered structure and having a thickness of 10 nm or more, and a lower semiconductor layer directly formed beneath the layered structure and having a thickness of 10 nm or more, the cladding layer of the first conductive type and the cladding layer of the second conductive type are made of a material containing phosphorus, and the at least one pair of the well layer and barrier layer and the lower semiconductor layer are made of a material that contains arsenic but does not substantially contain phosphorus.

* * * * *